US011108420B2

(12) United States Patent
Beamish et al.

(10) Patent No.: US 11,108,420 B2
(45) Date of Patent: Aug. 31, 2021

(54) DISCRETE TIME SUPERHETERODYNE MIXER

(71) Applicant: u-blox AG, Thalwil (CH)

(72) Inventors: Norman Beamish, Cork (IE); Mici McCullagh, Lisburn (GB)

(73) Assignee: u-blox AG, Thalwil (CH)

( * ) Notice: Subject to any disclaimer, the term of this patent is extended or adjusted under 35 U.S.C. 154(b) by 0 days.

(21) Appl. No.: 17/013,467

(22) Filed: Sep. 4, 2020

(65) Prior Publication Data

US 2021/0067187 A1  Mar. 4, 2021

Related U.S. Application Data

(63) Continuation of application No. 16/557,828, filed on Aug. 30, 2019.

(51) Int. Cl.
| | | |
|---|---|---|
| *H04L 27/06* | (2006.01) | |
| *H04B 1/30* | (2006.01) | |
| *H04B 1/16* | (2006.01) | |
| *H04B 1/10* | (2006.01) | |
| *H04B 1/26* | (2006.01) | |
| *H04B 17/318* | (2015.01) | |
| *H04B 17/336* | (2015.01) | |
| *H03D 7/12* | (2006.01) | |
| *H03D 7/16* | (2006.01) | |

(52) U.S. Cl.
CPC .............. *H04B 1/26* (2013.01); *H03D 7/125* (2013.01); *H03D 7/166* (2013.01); *H04B 1/1027* (2013.01); *H04B 17/318* (2015.01); *H04B 17/336* (2015.01)

(58) Field of Classification Search
CPC ...... H04B 1/26; H04B 17/318; H04B 17/336; H04B 1/1027; H04B 1/0007; H03D 7/125; H03D 7/166; G01S 19/13; G01S 19/36; G01S 19/33; G01S 19/32; H03K 9/00; H04L 27/00
See application file for complete search history.

(56) References Cited

U.S. PATENT DOCUMENTS 5,832,043 A    11/1998  Eory
6,891,423 B2 *  5/2005  Bjork ................... H03D 7/1441
                                                 327/355

(Continued)

FOREIGN PATENT DOCUMENTS

WO    WO 2011/033342 A1    3/2011

OTHER PUBLICATIONS

Madadi, et al, "A High IIP2 SAW-Less Superheterodyne Receiver with Multistage Harmonic Rejection," IEEE Journal of Solid-State Circuits, vol. 51, No. 2, pp. 332-347, Feb. 2016.

(Continued)

*Primary Examiner* — Pablo N Tran
(74) *Attorney, Agent, or Firm* — Finnegan, Henderson, Farabow, Garrett & Dunner LLP

(57) ABSTRACT

A receiver includes one or more mixers configured to sample an input analog signal at a plurality of discrete points in time to obtain a discrete-time sampled signal based on a local oscillating signal provided by a local oscillator; and a sample reordering circuit coupled to the one or more mixers and configured to reorder a sequence of samples received from the one or more mixers.

12 Claims, 13 Drawing Sheets

(56) References Cited

U.S. PATENT DOCUMENTS

| | | | | |
|---|---|---|---|---|
| 7,593,491 | B1* | 9/2009 | Khlat | H04B 1/30 |
| | | | | 329/302 |
| 7,672,689 | B2* | 3/2010 | Khlat | H04B 1/7115 |
| | | | | 455/552.1 |
| 8,090,320 | B2 | 1/2012 | Dent | |
| 8,107,908 | B2* | 1/2012 | Darabi | H04B 1/005 |
| | | | | 455/226.1 |
| 8,306,154 | B2 | 11/2012 | Ruegamer | |
| 8,594,603 | B2* | 11/2013 | Balankutty | H04B 1/12 |
| | | | | 455/296 |
| 8,761,700 | B2* | 6/2014 | Kenington | H04B 1/0483 |
| | | | | 455/146 |
| 8,874,059 | B2* | 10/2014 | Liu | H04W 52/0238 |
| | | | | 455/245.1 |
| 8,942,655 | B2* | 1/2015 | Beamish | H04B 1/30 |
| | | | | 455/226.1 |
| 9,209,910 | B2* | 12/2015 | Hedayati | H04B 15/06 |
| 9,431,961 | B2* | 8/2016 | Lakdawala | H04L 27/2089 |
| 9,954,497 | B2* | 4/2018 | Zhu | H03F 3/72 |
| 10,181,868 | B2* | 1/2019 | Harwalkar | H04B 1/16 |
| 10,355,726 | B2* | 7/2019 | Bardin | H04B 1/1027 |
| 10,644,735 | B2* | 5/2020 | Kinget | H04B 1/1027 |
| 2007/0096980 | A1* | 5/2007 | Gradincic | G01S 19/35 |
| | | | | 342/357.72 |
| 2009/0232108 | A1 | 9/2009 | Haghighat | |
| 2010/0048157 | A1* | 2/2010 | Carrera | H04B 1/28 |
| | | | | 455/307 |
| 2011/0222633 | A1* | 9/2011 | Pullela | H03D 7/165 |
| | | | | 375/318 |
| 2014/0194081 | A1 | 7/2014 | Tohidian | |
| 2016/0126894 | A1 | 5/2016 | Lakdawala | |

OTHER PUBLICATIONS

Sadjina et al, "A Mixed-Signal Circuit Technique for Cancellation of Interferers Modulated by LO Phase-Noise in 4G/5G CA Transceiver", IEEE Transactions on Circuits and Systems—I: Regular Papers, vol. 65, No. 11, pp. 3745-3755, Nov. 2018.

* cited by examiner

DISCRETE TIME SUPERHETERODYNE MIXER

FIELD

Apparatuses and methods consistent with the present disclosure relate generally to a receiver, and more particularly, to apparatuses including a discrete-time superheterodyne mixer and methods of operating the apparatuses.

BACKGROUND

A receiver in a communication device (e.g., a cellular phone) receives an input signal (e.g., a radio frequency signal) through an antenna and converts the input signal to a baseband frequency signal. This conversion may be done by a direct conversion (i.e., zero-intermediate frequency) receiver or by a superheterodyne receiver which converts the input signal to an intermediate frequency at an initial stage.

However, a zero-intermediate frequency receiver is typically vulnerable to interference caused by blockers located at odd harmonic frequencies of the fundamental carrier. On the other hand, a conventional superheterodyne receiver typically has off-chip architecture and requires power-hungry filters for image rejection. Improvements in the art are desired.

SUMMARY

According to some embodiments of the present disclosure, there is provided a receiver. The receiver includes one or more mixers configured to sample an input analog signal at a plurality of discrete points in time to obtain a discrete-time sampled signal based on a local oscillating signal provided by a local oscillator; and a sample reordering circuit coupled to the one or more mixers and configured to reorder a sequence of samples received from the one or more mixers.

According to some embodiments of the present disclosure, there is provided a receiver. The receiver includes: a local oscillator configured to generate a complex local oscillating signal by combining a plurality of local oscillating signals; and one or more mixers coupled to the local oscillator and configured to sample an input analog signal at a plurality of discrete points in time to obtain a discrete-time sampled signal based on the complex local oscillating signal.

According to some embodiments of the present disclosure, there is also provided a method for processing an input analog signal. The method includes: sampling the input analog signal at a plurality of discrete points in time to obtain a sampled signal based on a local oscillating signal; and reordering a sequence of samples in the sampled signal.

According to some embodiments of the present disclosure, there is also provided another method for processing an input analog signal. The method includes: generating a complex local oscillating signal based on a combination of a plurality of local oscillating signals; and sampling the input analog signal at a plurality of discrete points in time based on the generated complex local oscillating signal.

According to some embodiments of the present disclosure, there is also provided a device. The device includes: a receiver configured to receive an input analog signal and operate in a plurality of operating modes, wherein the receiver includes: a local oscillator configured to generate a plurality of local oscillating signals; and one or more mixers configured to sample the input analog signal at a plurality of discrete points in time to obtain a sampled signal based on a local oscillating signal of the plurality of local oscillating signals; and a controller configured to determine whether to switch an operating mode of the receiver to another operating mode of the plurality of operating modes based on performance of the receiver.

According to some embodiments of the present disclosure, there is also provided a method for operating a receiver, wherein the receiver may be configured to operate in a plurality of operating modes. The method includes: operating the receiver in a first operating mode of the plurality of operating modes; determining whether performance of the receiver is lower than a threshold level; in response to a determination that the performance of the receiver is lower than the threshold level, determining whether an in-band blocker signal is detected; and in response to a determination that the in-band blocker signal is not detected, switching the first operating mode of the receiver to a second operating mode of the plurality of operating modes.

According to some embodiments of the present disclosure, there is also provided a device. The device includes: a plurality of receivers each configured to operate in a plurality of operating modes, wherein each of the plurality of receivers includes a local oscillator configured to provide a plurality of local oscillating signals; and a controller configured to compare performance of the plurality of receivers and determine whether to switch an operating mode of at least one receiver of the plurality of receivers to another operating mode of the plurality of operating modes.

According to some embodiments of the present disclosure, there is also provided a method for operating a device including a plurality of receivers, wherein each of the plurality of receivers is configured to operate in a plurality of operating modes. The method includes: operating a first receiver of the plurality of receivers in a first operating mode based on a first local oscillating signal; operating a second receiver of the plurality of receivers in a second operating mode based on a second local oscillating signal; determining whether a difference in performance between the first receiver and the second receiver is greater than a threshold value; and in response to a determination that the difference in the performance is greater than the threshold value, switching the operating mode of the first receiver or the operating mode of the second receiver to another operating mode of the plurality of operating modes.

According to some embodiments of the present disclosure, there is further provided a non-transitory computer-readable medium having stored therein instructions that, when executed by a processor of a controller, perform a method for processing an input analog signal. The method includes: sampling the input analog signal at a plurality of discrete points in time to obtain a sampled signal based on a local oscillating signal; and reordering, by a sample reordering circuit, a sequence of samples in the sampled signals.

DETAILED DESCRIPTION

Figure 1:
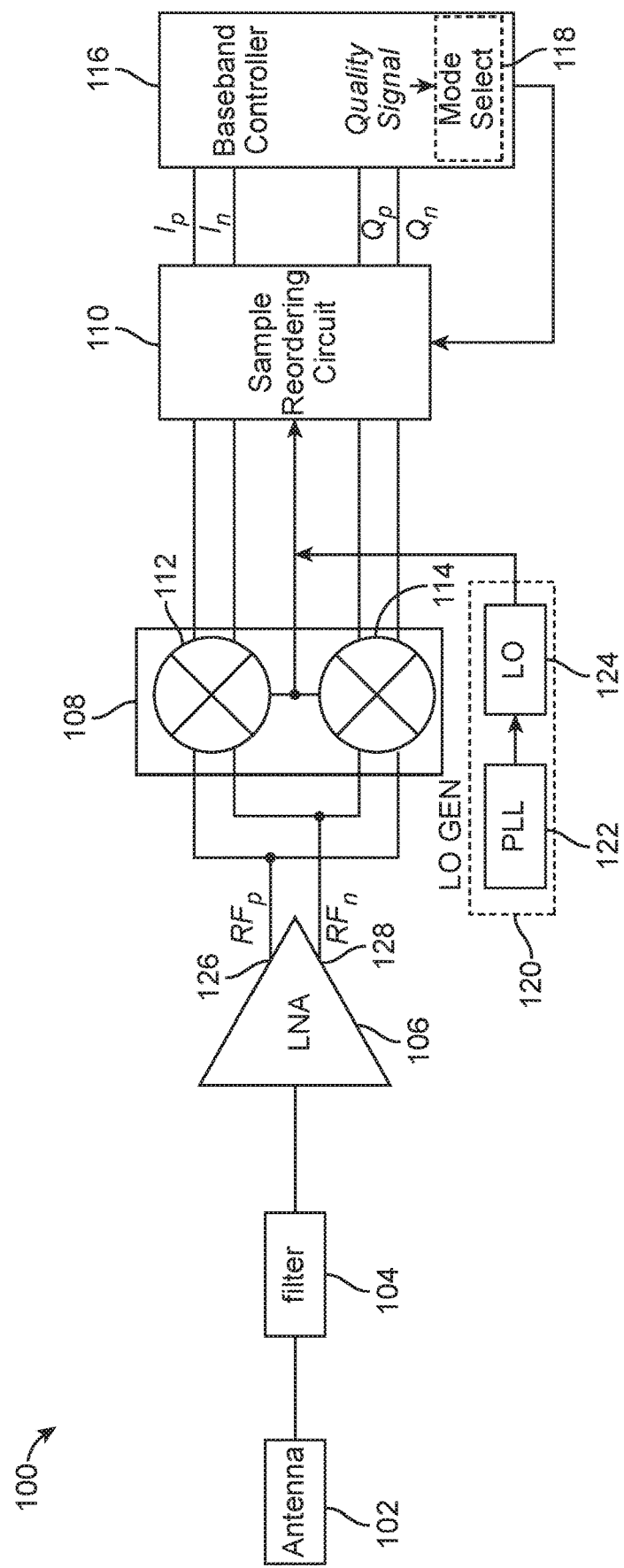
FIG. 1 is a schematic diagram illustrating an exemplary design of a receiver, consistent with some embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the present disclosure. Instead, they are merely examples of systems, apparatuses, and methods consistent with aspects related to the present disclosure as recited in the appended claims.

A zero-IF receiver typically uses a passive sampling mixer and is vulnerable to interference caused by blockers located at odd harmonic frequencies of the fundamental carrier. The interference caused by blockers may be suppressed by adding a lowpass filter at the receiver input. However, such a lowpass filter may cause increased size of the receiver and increased cost to the receiver design. Moreover, such a lowpass filter may cause an insertion loss in the receiver signal path, thereby degrading performance of the receiver.

The problem of the harmonic blockers may be mitigated by adopting a superheterodyne receiver. However, a superheterodyne receiver typically has off-chip architecture, and requires costly, power-hungry filters for image rejection. It is therefore desirable to have an on-chip integrated receiver that does not require lowpass filters and does not have a vulnerability to the harmonic blockers.

Moreover, for Long-Term Evolution (LTE) Carrier Aggregation (CA) receivers, a receiver is required to receive signals at two or more frequencies simultaneously. This typically requires the generation of two distinct carrier frequencies. This frequency generation process may result in the generation of unwanted frequency spurs which can then in turn combine with the transmitted signal to create interference. The likelihood of unwanted spurs increases as the number of CA components increases. In 5G LTE, there are up to 16 CA components. It is therefore desirable to have a receiver that has sufficient frequency agility to avoid the interference.

Embodiments of the present disclosure provide a receiver implementing a sample reordering circuit to change a sequence of time-discrete samples of an input signal generated by a mixer, thereby changing a mixing waveform of the input signal. Embodiments of the present disclosure also provide a receiver that generates a complex local oscillating signal and samples an input signal based on the complex local oscillating signal, thereby obtaining a desired mixing waveform of the input signal, without using a sample reordering circuit. Embodiments of the present disclosure further provide methods of operating a single receiver or multiple receivers by switching an operating mode of a receiver to another operating mode based on performance of the receiver.

Embodiments disclosed in the present disclosure have one or more technical effects. In some embodiments, the receivers are capable of changing a mixing waveform of an analog input signal by reordering discrete-time mixed samples or by mixing the input signal based on a complex local oscillating signal. This permits use of a local oscillating frequency at a frequency different from a center frequency of a selected channel, thereby suppressing interference caused by harmonic blockers in a zero-IF receiver, leading to an enhanced signal quality. In some embodiments, the receivers may implement two or more mixers including an in-phase mixer and a quadrature phase mixer. This allows for a negative frequency image rejection, leading to an enhanced signal quality. In some embodiments, methods provide monitoring performance of a receiver and switching an operating mode of the receiver to another operating mode, by reordering time-discrete mixed samples or by mixing signals based on a complex local oscillating signal. This may prevent degradation of performance of the receivers, leading to enhanced agility of the receivers.

FIG. 1 is a schematic diagram illustrating an exemplary design of a receiver, consistent with some embodiments of the present disclosure. Referring to FIG. 1, an exemplary receiver 100 includes an antenna 102, a filter 104, a low-noise amplifier (LNA) 106, a mixer 108, a sample reordering circuit 110, a baseband controller 116 including a mode selector 118, and a local oscillating signal (LO) generator 120. Mixer 108 includes a first mixer 112 and a second mixer 114. LO generator 120 includes a phase-locked loop (PLL) circuit 122 and a local oscillating signal (LO) constructor 124. Antenna 102 may be configured to receive signals from one or more sources. In some embodiments, a signal received by antenna 102 may be a radio frequency (RF) signal in communication systems. However, the signals are not so limited, such that the signals received by antenna 102 can be any electromagnetic waves transmitted from any sources.

A signal received by antenna 102 is first passed through filter 104 (e.g., a bandpass filter) to suppress frequencies outside a range of interest. The filtered signal is then passed to LNA 106 and amplified by LNA 106. In an embodiment, LNA 106 may include a controller that controls parameters of an amplified signal. The parameters may include at least one of: gain, noise, linearity, bandwidth, output dynamic range, slew rate, rise rate, overshoot, or stability factor. In an embodiment, filter 104 is not implemented in receiver 100 and LNA 106 is directed coupled to antenna 102.

In some embodiments, LNA 106 may be a single-input to differential-outputs amplifier, for example, as shown in FIG. 1. In some embodiments, LNA 106 may instead be a differential-inputs to differential-outputs amplifier. In FIG. 1, LNA 106 includes a positive differential output 126 that outputs a signal having a positive component (e.g., an RF voltage signal having a positive component expressed as RFp), and a negative differential output 128 that outputs a signal having a negative component (e.g., an RF voltage signal having a negative component expressed as RFn). In an embodiment, each of the differential outputs 126 and 128 may output an in-phase signal and a quadrature phase signal. In an embodiment, LNA 106 may be optional and can be omitted.

In an embodiment, mixer 112 may be an in-phase mixer and mixer 114 may be a quadrature phase mixer. In this embodiment, in-phase mixer 112 may be coupled to differential outputs 126 and 128 of LNA 106 and configured to receive a positive in-phase signal from positive differential output 126 and a negative in-phase signal from negative differential output 128. Similarly, quadrature phase mixer 114 may be coupled to the differential outputs 126 and 128 of LNA 106 and configured to receive a positive quadrature phase signal from positive differential output 126 and a negative quadrature phase signal from negative differential output 128. Each of mixers 112 and 114 may be configured to sample the received amplified signal at a plurality of discrete points in time to obtain a discrete-time sampled signal based on a local oscillating signal provided by LO generator 120.

The discrete-time sampled signals obtained by mixers 112 and 114 are then transmitted to sample reordering circuit 110 that is coupled to mixers 112 and 114. Sample reordering circuit 110 is configured to change a sequence of the samples received from mixers 112 and 114, by performing another sampling on the samples received from mixers 112 and 114. In an embodiment, the sampling in sample reordering circuit 110 is controlled by a clock signal generated by LO generator 120. The clock signal may be generated by dividing the local oscillating signal generated for mixer 108.

For example, LO generator 120 may include a reference oscillator such as a crystal oscillator or a voltage-controlled oscillator, or the like (not shown) that generates a reference signal. PLL 122 receives the reference signal and generates an oscillator signal. LO constructor 124 receives the oscillator signal from PLL 122 and generates a local oscillating signal for receiver 100. The local oscillating signal generated by LO constructor 124 is the local oscillating signal provided to mixer 108. A frequency of the local oscillating signal for mixer 108 may be expressed as $f_{LO}$. In an embodiment, LO constructor 124 includes a frequency divider that divides the frequency $f_{LO}$ to generate an additional local oscillating signal that is used as a clock signal for sample reordering circuit 110. A frequency of the clock signal for sample reordering circuit 110 may be expressed as $f_{LO}/N$, where N is an integer. For example, if N=4, the frequency of the clock signal for sample reordering circuit 110 is $f_{LO}/4$ and this clock signal controls the sampling in sample reordering circuit 110 and thereby controls a waveform of a sample-reordered signal. In an alternative embodiment, sample reordering circuit 110 may have its own clock signal generator independent from LO generator 120. In another embodiment, LO generator 120 may be configured to generate a plurality of different clock signals for sample reordering circuit 110.

In some embodiments, sample reordering circuit 110 performs a second sampling on the positive in-phase signal (Ip), the negative in-phase signal (In), the positive quadrature phase signal (Qp), and the negative quadrature phase signal (Qn) that were first sampled by mixers 112 and 114, and outputs the sampled signals to baseband controller 116. Baseband controller 116 checks quality of the sampled signals and determines a desired waveform. Based on the desired waveform, mode selector 118 of baseband controller 116 selects a mode and provides a feedback signal to sample reordering circuit 110. For example, if a current operating mode is a zero-IF mode and baseband controller 116 determines that quality of the sampled signals is not satisfactory, mode selector 118 may select a mode other than the zero-IF mode and provide a feedback signal to sample reordering circuit 110. Sample reordering circuit 110 determines a desired reordering sequence of the samples based on the feedback signal. In an alternative embodiment, sample reordering circuit 110 may provide a feedback signal (not shown) to LO generator 120 such that LO generator 120 can provide a desired clock signal to sample reordering circuit 110.

In an embodiment, the mode selected by mode selector 118 may be a superheterodyne mode such that receiver 100 operates in a superheterodyne mode. In this embodiment, by a reordering operation, sample reordering circuit 110 shifts the sampled signal to an intermediate frequency determined by a difference between a frequency of the input signal and the frequency of the local oscillating signal. The amount of the shifting is determined by the feedback signal provided by mode selector 118.

By utilizing a sample reordering circuit, e.g., sample reordering circuit 110, coupled to a mixer, e.g., mixer 108, discrete-time samples outputted from the mixer are reordered, and thereby an effect of the superheterodyne receiver is achieved without implementing off-chip architecture and power-hungry filters. As a result, a local oscillating frequency can be a frequency different from a center frequency of a desired channel, thereby suppressing interference caused by harmonic blockers in zero-IF mode. Moreover, by using a discrete-time quadrature phase mixer, e.g., quadrature phase mixer 114, negative frequency image rejection is achieved, further enhancing signal quality.

Figure 2A:
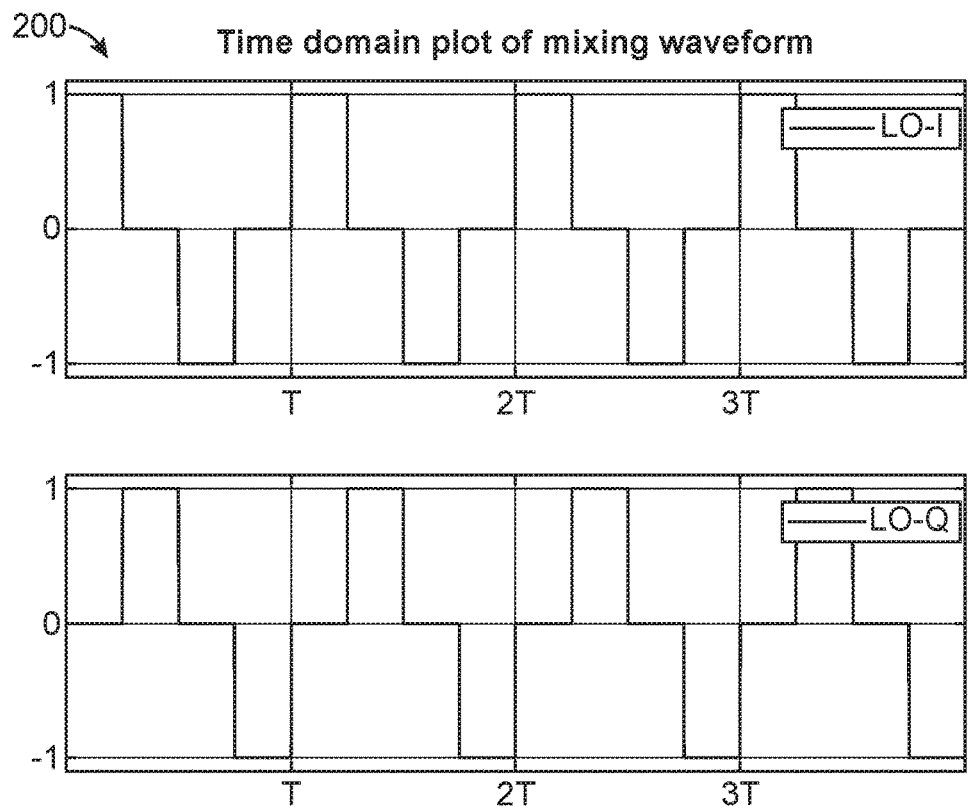
FIG. 2A is a schematic diagram illustrating exemplary time domain plots of mixing waveforms of a zero-intermediate frequency (IF) receiver without implementing a sample reordering circuit.

FIG. 2A is a schematic diagram illustrating exemplary time domain plots of mixing waveforms of a zero-IF receiver without implementing a sample reordering circuit. For example, mixing waveforms 200 may be obtained by a mixer, such as mixer 108 of FIG. 1, without implementing a sample reordering circuit. Referring to FIG. 2A, for an in-phase mixing waveform (top of FIG. 2A), over one local oscillating signal period T, mixer 108 switches the in-phase differential RF inputs (RFp and RFn) to baseband outputs in a sequence of (RFp, 0, RFn, 0), corresponding to the (1, 0, −1, 0) on the y-axis of the figure, and repeats the same outputs in the subsequent periods. For a quadrature phase mixing waveform (bottom of FIG. 2A), over one local oscillating signal period T, mixer 110 switches the quadrature phase differential RF inputs (RFp and RFn) to baseband outputs in a sequence of (0, RFp, 0, RFn), corresponding to the (0, 1, 0, −1) on the y-axis of the figure, and repeats the same outputs in the subsequent periods. Therefore, an effective zero-IF mixing waveform has a peak at the local oscillating frequency and the local oscillating frequency is at the center of a selected channel. This indicates that the receiver is vulnerable to interference caused by blockers located at odd harmonic frequencies. An RF lowpass filter and/or bandpass filter may be needed to attenuate RF energy at LO harmonics to protect the zero-IF receiver without sample reordering from de-sensing.

Figure 2B:
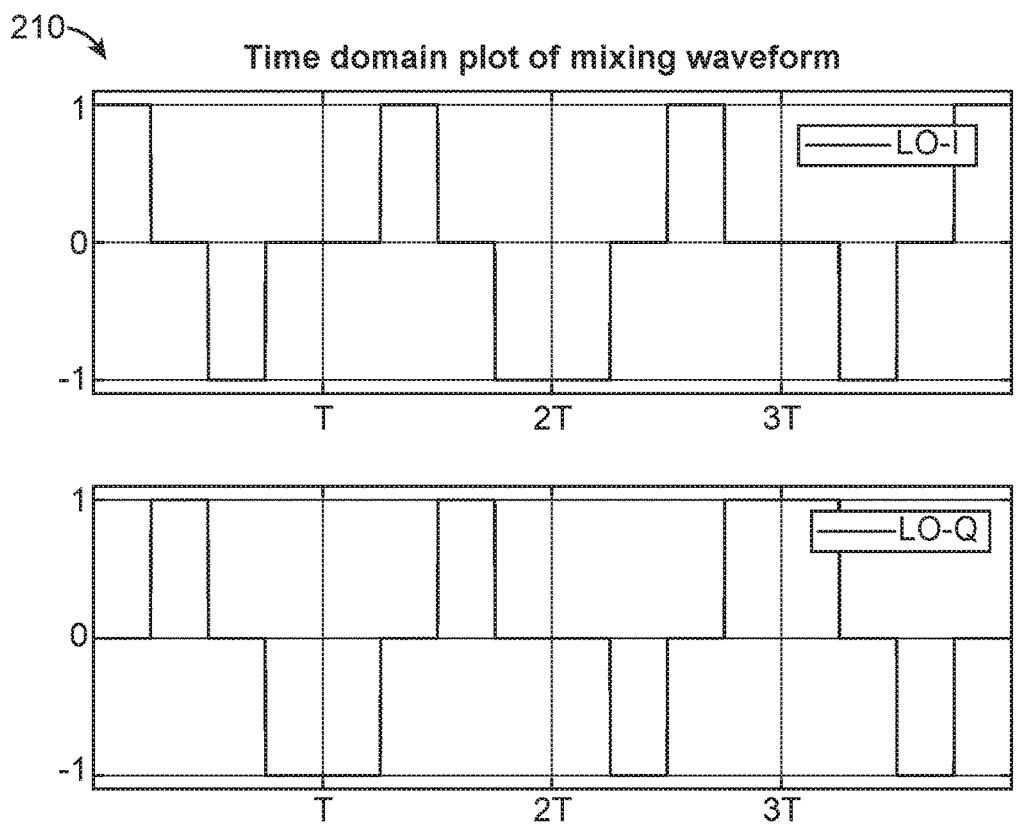
FIG. 2B is a schematic diagram illustrating exemplary time domain plots of mixing waveforms of a zero-IF receiver implementing a sample reordering circuit, consistent with some embodiments of the present disclosure.

FIG. 2B is a schematic diagram illustrating exemplary time domain plots of mixing waveforms of a zero-IF receiver implementing a sample reordering circuit, consistent with some embodiments of the present disclosure. For example, mixing waveforms 210 may be obtained by implementing a sample reordering circuit, such as sample reordering circuit 110 of FIG. 1, that performs a second sampling on the time-discrete samples outputted from mixer 108. Compared with mixing waveforms 200, mixing waveforms 210 have different effective mixing signals. Referring to FIG. 2B, for an in-phase mixing waveform (top of FIG. 2B), over four local oscillating signal periods 4T, mixer 108 switches the in-phase differential RF inputs (RFp and RFn) to baseband outputs in a sequence of (RFp, 0, RFn, 0), (0, RFp, 0, RFn), (RFn, 0, RFp, 0) and (0, RFn, 0, RFp), corresponding to the (1, 0, −1, 0), (0, 1, 0, −1), (−1, 0, 1, 0) and (0, −1, 0, 1) on the y-axis of the figure. For the quadrature phase mixing waveform (bottom of FIG. 2B), over four local oscillating signal periods 4T, mixer 110 switches the quadrature phase differential RF inputs (RFp and RFn) to baseband outputs in a sequence of (0, RFp, 0, RFn), (RFn, 0, RFp, 0), (0, RFn, 0, RFp) and (RFp, 0, RFn, 0), corresponding to the (0, 1, 0, −1), (−1, 0, 1, 0), (0, −1, 0, 1) and (1, 0, −1, 0) on the y-axis of the figure. Therefore, the local oscillating frequency is at a frequency different from the center of the desired channel. This may suppress interference caused by harmonic blockers located at odd harmonic frequencies.

Figure 3A:
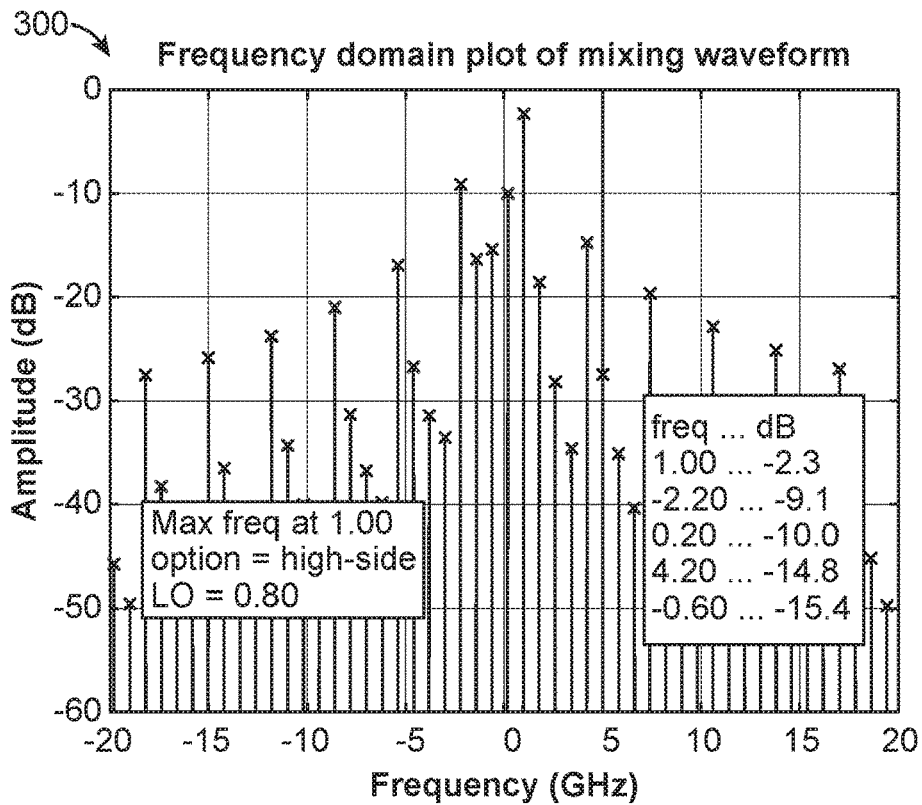
FIG. 3A is a schematic diagram illustrating an exemplary frequency domain plot of a mixing waveform of a zero-IF receiver implementing a sample reordering circuit, consistent with some embodiments of the present disclosure.

FIG. 3A is a schematic diagram illustrating an exemplary frequency domain plot of a mixing waveform 300 of a zero-IF receiver implementing a sample reordering circuit, consistent with some embodiments of the present disclosure. As shown in FIG. 3A, in an example, the local oscillating signal frequency is 0.8 GHz, while the center frequency of the desired channel is 1 GHz. That is, the generated local oscillating signal is at a frequency lower than the center frequency of the selected frequency channel, which is referred to as high-side mixing. As shown in FIG. 3A, the amplitude of the signal at odd harmonics is reduced.

Figure 3B:
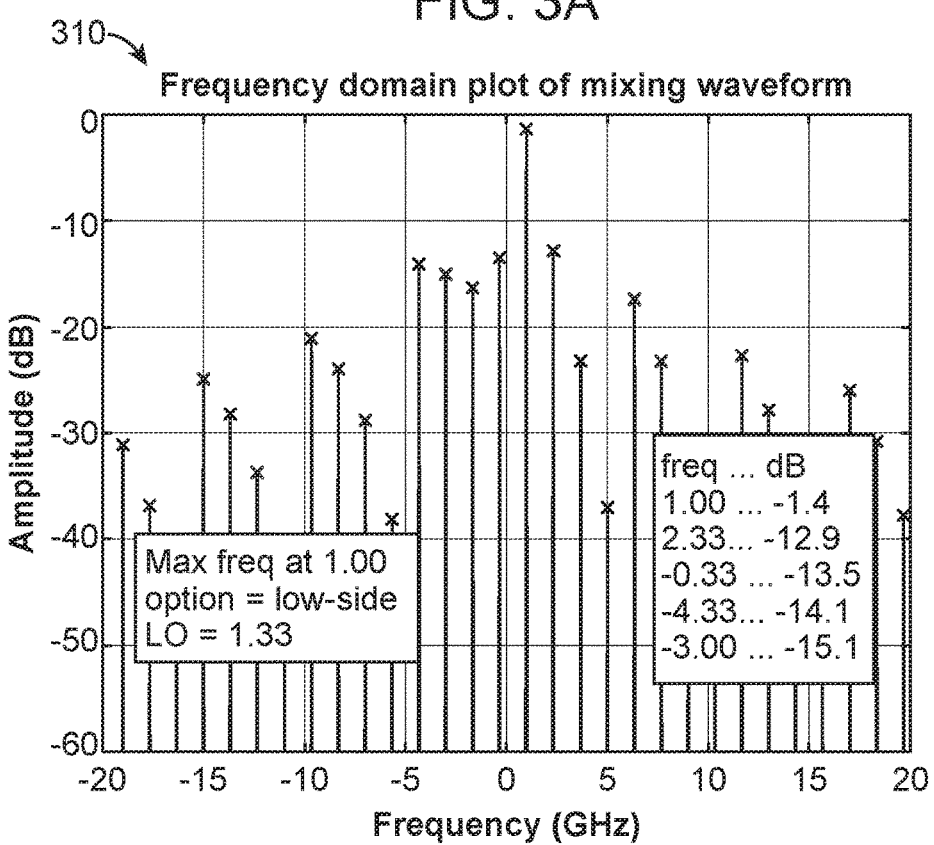
FIG. 3B is a schematic diagram illustrating an exemplary frequency domain plot of another mixing waveform of a zero-IF receiver implementing a sample reordering circuit, consistent with some embodiments of the present disclosure.

FIG. 3B is a schematic diagram illustrating an exemplary frequency domain plot of another mixing waveform 310 of a zero-IF receiver implementing a sample reordering circuit, consistent with some embodiments of the present disclosure. As shown in FIG. 3B, in an example, the local oscillating signal frequency is 1.33 GHz, while the center frequency of the desired channel is 1 GHz. That is, the generated local oscillating signal is at a frequency higher than the center frequency of the selected frequency channel, which is referred to as low-side mixing. As shown in FIG. 3A, the amplitude of the signal at odd harmonics is reduced.

In this way, the receiver that implements the sample reordering circuit may suppress interference caused by harmonic blockers, thereby enhancing signal quality, without utilizing costly filters for the blockers.

Figure 4:
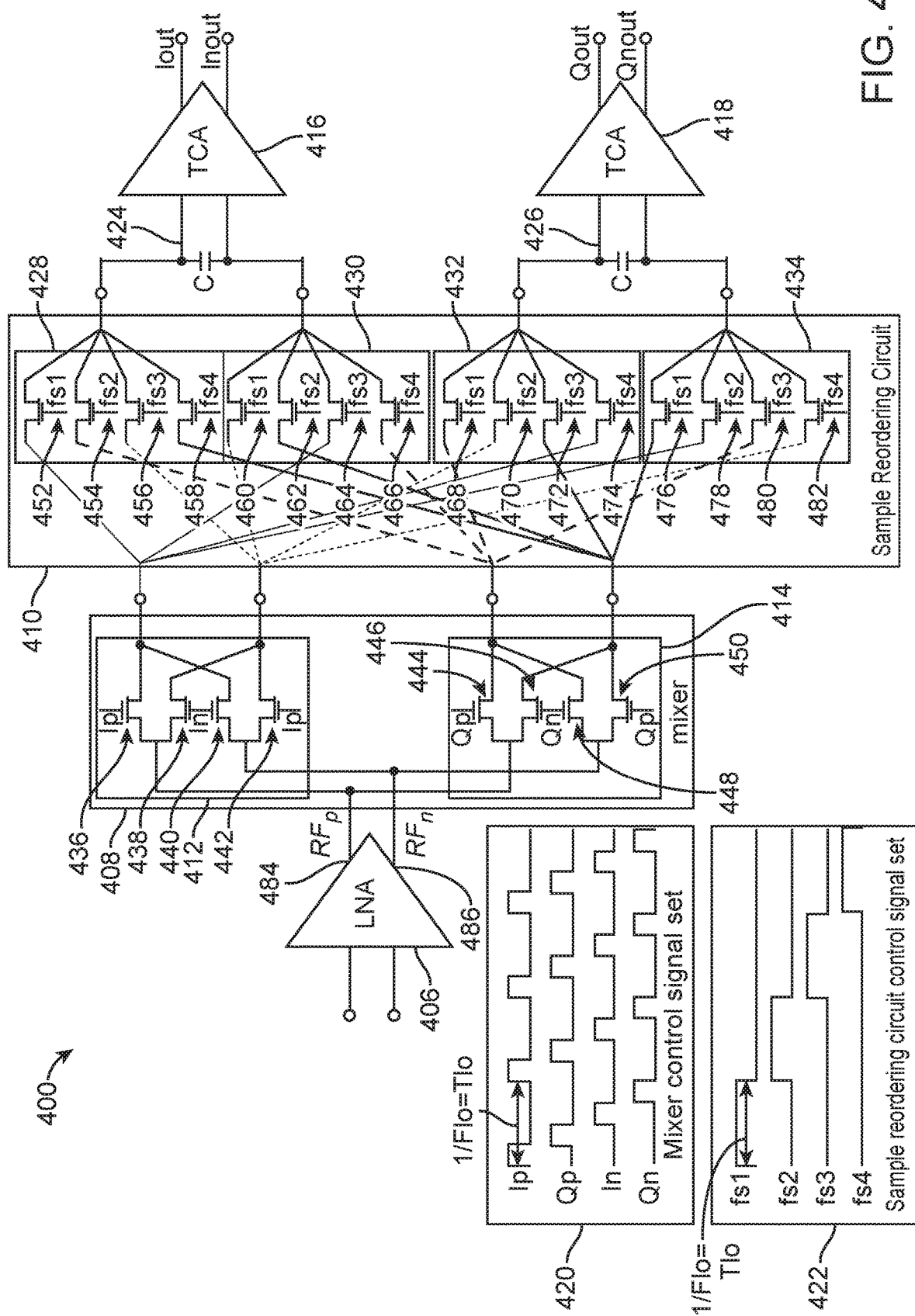
FIG. 4 is a schematic diagram illustrating an exemplary configuration of a receiver, consistent with some embodiments of the present disclosure.

FIG. 4 is a schematic diagram illustrating an exemplary configuration of a receiver, consistent with some embodiments of the present disclosure. Referring to FIG. 4, an exemplary receiver 400 includes a low-noise amplifier (LNA) 406, a mixer 408, and a sample reordering circuit 410. For clarity, FIG. 4 omits other components of receiver 400 such as an antenna, analog-to-digital converter, etc. A signal transmitted to LNA 406 may include differential signals and LNA 406 may be a differential-inputs to differential-outputs amplifier. LNA 406 includes a positive differential output 484 that outputs a signal having a positive component (e.g., an RF voltage signal having a positive component RFp), and a negative differential output 486 that outputs a signal having a negative component (e.g., an RF voltage signal having a negative component RFn). Each of the differential outputs 484 and 486 may output an in-phase signal and a quadrature phase signal to mixer 408.

Mixer 408 includes an in-phase mixer 412 and a quadrature phase mixer 414. In-phase mixer 412 includes transistors 436, 438, 440, and 442 arranged as shown in the figure, and quadrature phase mixer 414 includes transistors 444, 446, 448, and 450 arranged as shown in the figure. Each of the transistors in mixers 412 and 414 is controlled by a corresponding control signal, included in a mixer control signal set 420. Mixer control signal set 420 includes in-phase positive control signal Ip, quadrature phase positive control signal Qp, in-phase negative control signal In, and quadrature phase negative control signal Qn that are configured to control sampling of in-phase positive signals, quadrature phase positive signals, in-phase negative signals, and quadrature phase negative signals, respectively. Each of control signals Ip, Qp, In, and Qn is a pulsed signal. The four control signals Ip, Qp, In, and Qn have the same pulse width. The pulses of the four control signals Ip, Qp, In, and Qn are time shifted with respect to each other by the pulse width of the pulses. For example, when Ip falls from a high signal level to a low signal level so that the pulse is ending, Qp rises from a low signal level to a high signal level.

In in-phase mixer 412, transistor 436 is controlled by the in-phase positive control signal Ip (in signal set 420), transistors 438 and 440 are controlled by in-phase negative control signal In (in signal set 420), and transistor 442 is controlled by in-phase positive control signal Ip (in signal set 420). Similarly, in quadrature phase mixer 414, transistor 444 is controlled by the quadrature phase positive control signal Qp (in signal set 420), transistors 446 and 448 are controlled by quadrature phase negative control signal Qn (in signal set 420), and transistor 450 is controlled by quadrature phase positive control signal Qp (in signal set 420). Mixer control signal set 420 may be a local oscillating signal generated by a local oscillating signal generator, such as LO generator 120 in FIG. 1. A quadrature phase control signal may be generated from an in-phase control signal by a 90° phase shifting.

Each of the transistors in in-phase mixer 412 is coupled to differential outputs 484 and 486 of LNA 406 and configured to receive a positive in-phase signal from positive differential output 484 and a negative in-phase signal from negative differential output 486. Similarly, each of the transistors in quadrature phase mixer 414 is coupled to differential outputs 484 and 486 of LNA 406 and configured to receive a positive quadrature phase signal from positive differential output 484 and a negative quadrature phase signal from negative differential output 486. Each of the transistors in mixers 412 and 414 are configured to sample the received amplified signal at a plurality of discrete points in time to obtain a discrete-time sampled signal under the control of the control signals.

The discrete-time sampled signals obtained by mixers 412 and 414 are transmitted to sample reordering circuit 410 that is coupled to mixer 408. Sample reordering circuit 410 includes a first set of transistors 428 including transistors 452, 454, 456, and 458 connected in parallel, a second set of transistors 430 including transistors 460, 462, 464, and 466 connected in parallel, a third set of transistors 432 including transistors 468, 470, 472, and 474 connected in parallel, and a fourth set of transistors 434 including transistors 476, 478, 480, and 482 connected in parallel. Each set of transistors 428, 430, 432, and 434 has one transistor configured to receive a sampled positive in-phase signal from mixer 412, one transistor configured to receive a sampled negative in-phase signal from mixer 412, one transistor configured to receive a sampled positive quadrature phase signal from mixer 414, and one transistor configured to receive a sampled negative quadrature phase signal from mixer 414.

ON/OFF states of the transistors of sample reordering circuit 410 are controlled by a sample reordering circuit control signal set 422. Sample reordering circuit control signal set 422 includes control signals fs1, fs2, fs3, and fs4. Each of control signal fs1, fs2, fs3, and fs4 is a pulsed signal with pulse width Tlo. The pulses of the four control signals are time shifted with respect to each other by Tlo. For example, when fs1 falls from a high signal level to a low signal level when the pulse ends, fs2 rises from the low signal level to the high signal level. In an embodiment, sample reordering control signal set 422 is generated by dividing the frequency of the local oscillating signal generated for mixer 408 by 4. In this case, the pulse width of each of the pulses of sample reordering circuit control signal set 422 is four times the pulse width of the pulses of mixer control signal set 420. For example, during one pulse width of the signal fs1, the rising and ending of all four pulses Ip, Qp, In, and Qn occur.

Each set of transistors 428, 430, 432, and 434 of sample reordering circuit 410 has one transistor configured to receive fs1, one transistor configured to receive fs2, one transistor configured to receive fs3, and one transistor configured to receive fs4. By controlling the ON/OFF state and the duration of the ON/OFF state of the transistors, sample reordering circuit 410 selectively transmits one of the four signals (positive in-phase, negative in-phase, positive quadrature phase, and negative quadrature phase) outputted from mixer 408, thereby reordering a sequence of the time-discrete samples outputted from mixer 408.

In some embodiments, a filter may be coupled to the outputs of sample reordering circuit 410. For example, the filter may include capacitors 424 and 426. The outputs of first set of transistors 428 are coupled to a first terminal of capacitor 424, and the outputs of second set of transistors 430 are coupled to a second terminal of capacitor 424. Similarly, the outputs of third set of transistors 432 are coupled to a first terminal of capacitor 426, the outputs of fourth set of transistors 434 are coupled to a second terminal of capacitor 426. Capacitor 424 is coupled to a transconductance amplifier (TCA) 416 to output the filtered in-phase differential signals to TCA 416. Similarly, capacitor 426 is coupled to TCA 418 to output the filtered quadrature phase differential signals to TCA 418.

As explained above, in the exemplary embodiment shown in FIG. 4, sample reordering circuit 410 includes sets of transistors. However, the sample reordering circuit is not so limited, and any switches or devices capable of selecting the samples outputted by mixer 408 may be implemented in the sample reordering circuit. Similarly, the transistors of the mixer 408 can be any type of transistors, switches, or devices capable of performing time-discrete sampling function.

Figure 5:
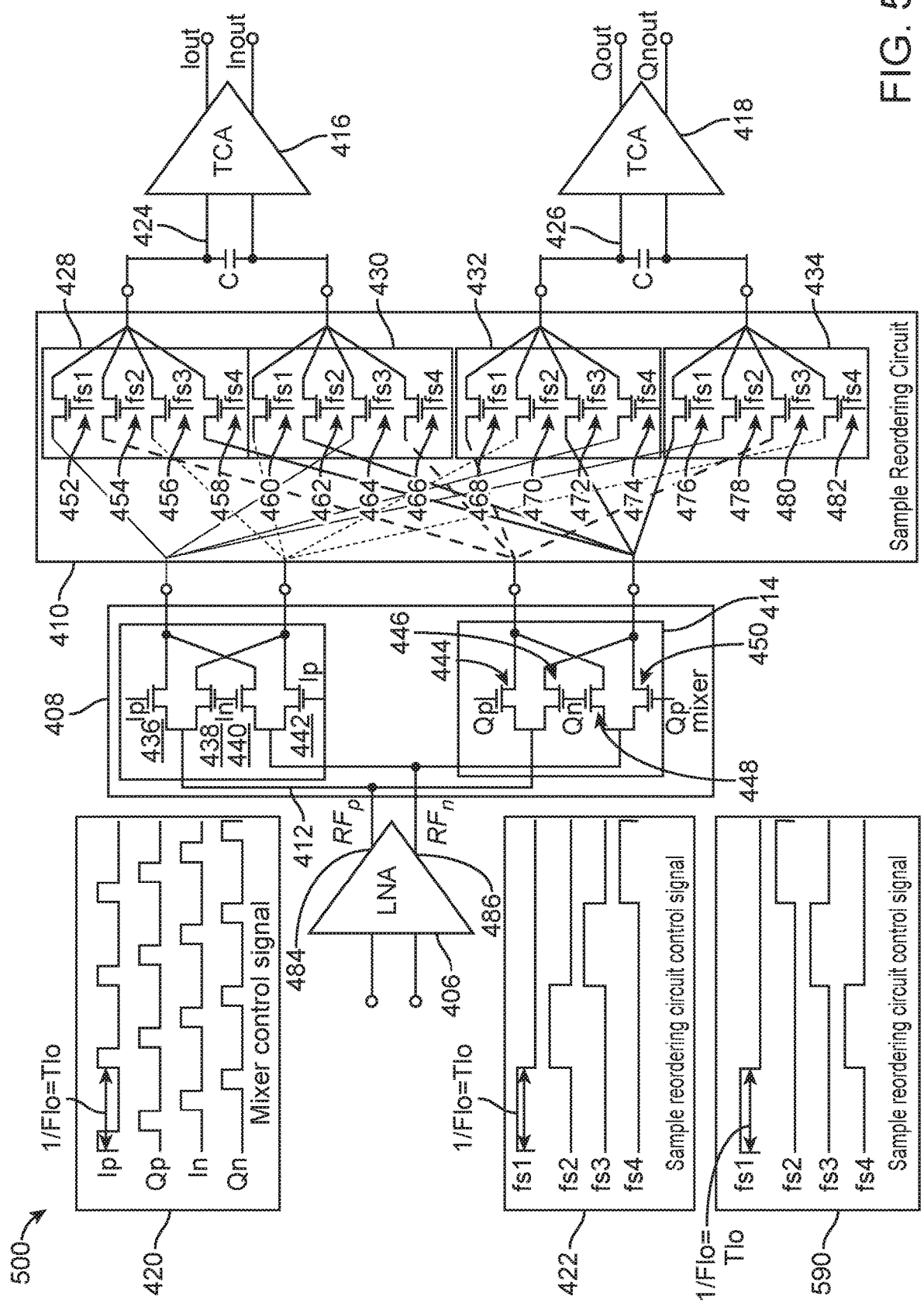
FIG. 5 is a schematic diagram illustrating another exemplary configuration of a receiver, consistent with some embodiments of the present disclosure.

FIG. 5 is a schematic diagram illustrating another exemplary configuration of a receiver, consistent with some embodiments of the present disclosure. Referring to FIG. 5, a receiver 500 has a configuration similar to that of receiver 400 in FIG. 4, except that receiver 500 uses two different sets of control signals to control the sample reordering circuit. For brevity, the same components are denoted by the same reference symbols and the description of the same components is omitted here. Compared with receiver 400 in FIG. 4, receiver 500 in FIG. 5 includes an additional sample reordering circuit control signal set 590. Sample reordering circuit control signal set 590 includes control signals fs1, fs2, fs3, and fs4. Each of control signal fs1, fs2, fs3, and fs4 is a pulsed signal with pulse width Tlo. Unlike sample reordering circuit control signal set 422, the pulse of fs2 is shifted with respect to the pulse of fs1 by 3Tlo, and the pulses of fs2, fs3, and fs4 are shifted with respect to each other by Tlo. For example, when fs1 falls from a high signal level to a low signal level when the pulse ends, rather than fs2, fs4 rises from the low signal level to the high signal level. When fs4 falls from the high signal level to the low signal level when the pulse ends, fs3 rises from the low signal level to the high signal level, and when fs3 falls from the high signal level to the low signal level when the pulse ends, fs2 rises from the low signal level to the high signal level. By applying two different sets of sample reordering circuit control signals, more variety of mixing waveforms may be obtained, leading to enhanced signal quality.

Figure 6:
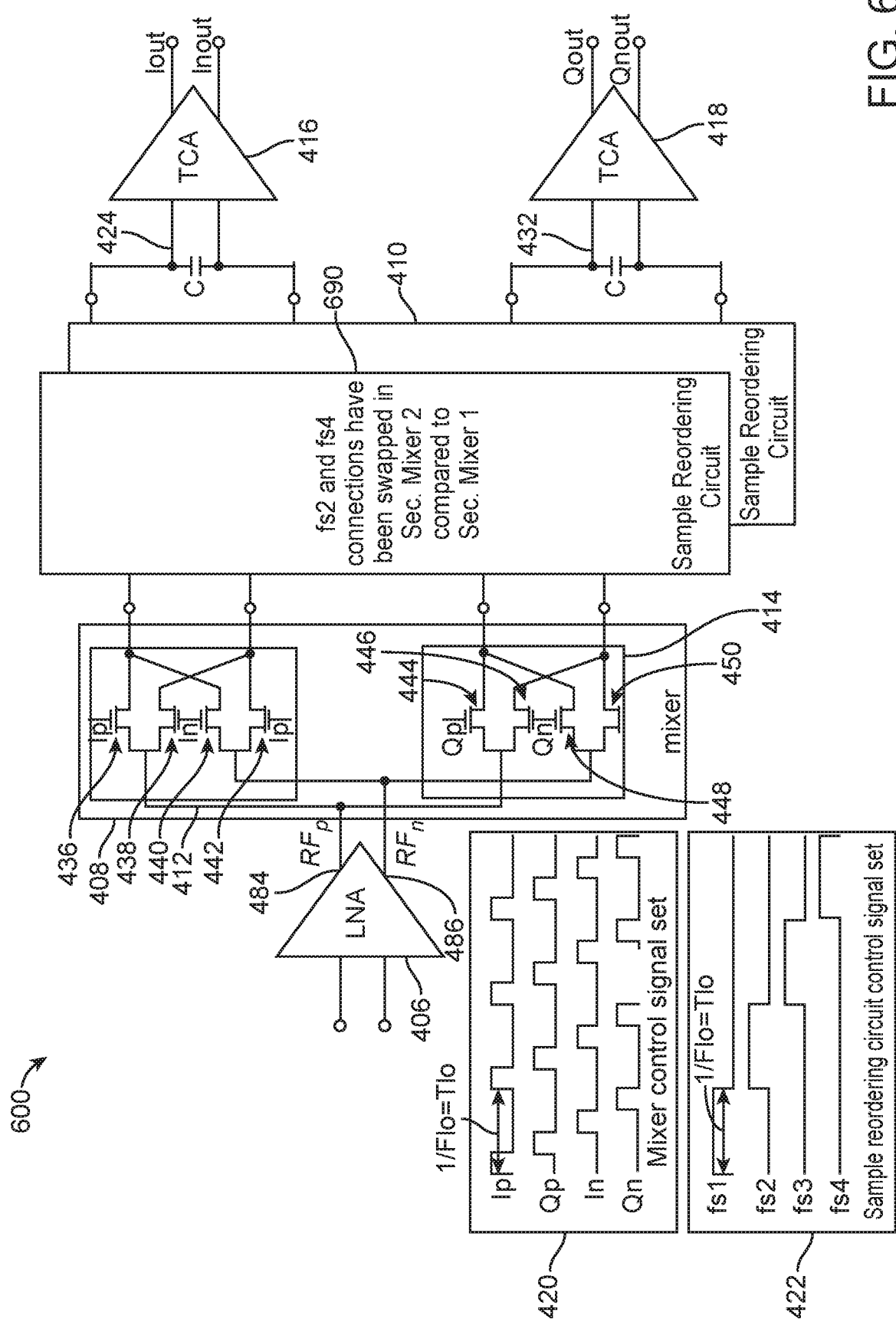
FIG. 6 is a schematic diagram illustrating another exemplary configuration of a receiver, consistent with some embodiments of the present disclosure.

FIG. 6 is a schematic diagram illustrating another exemplary configuration of a receiver, consistent with some embodiments of the present disclosure. Referring to FIG. 6, a receiver 600 has a configuration similar to that of receiver 400 in FIG. 4, except that receiver 600 includes two sample reordering circuits. For brevity, the same components are denoted by the same reference symbols and the description of the same components is omitted here. Compared with receiver 400 in FIG. 4, receiver 600 in FIG. 6 includes an additional sample reordering circuit 690. Sample reordering circuit 690 is also controlled by sample reordering circuit control signal set 422 that includes control signals fs1, fs2, fs3, and fs4. However, compared with sample reordering circuit 410, the connections between the control signals and the transistors of sample reordering circuit 690 are swapped. For example, compared with sample reordering circuit 410, the connections of control signals fs2 and fs4 are swapped in sample reordering circuit 690. As another example, compared with sample reordering circuit 410, the connections of control signals fs1 and fs3 are swapped in sample reordering circuit 690. In an embodiment, sample reordering circuits 410 and 690 may be connected in parallel. By implementing two sample reordering circuits having different control signal connections, a greater variety of mixing waveforms may be obtained, leading to enhanced signal quality.

Figure 7:
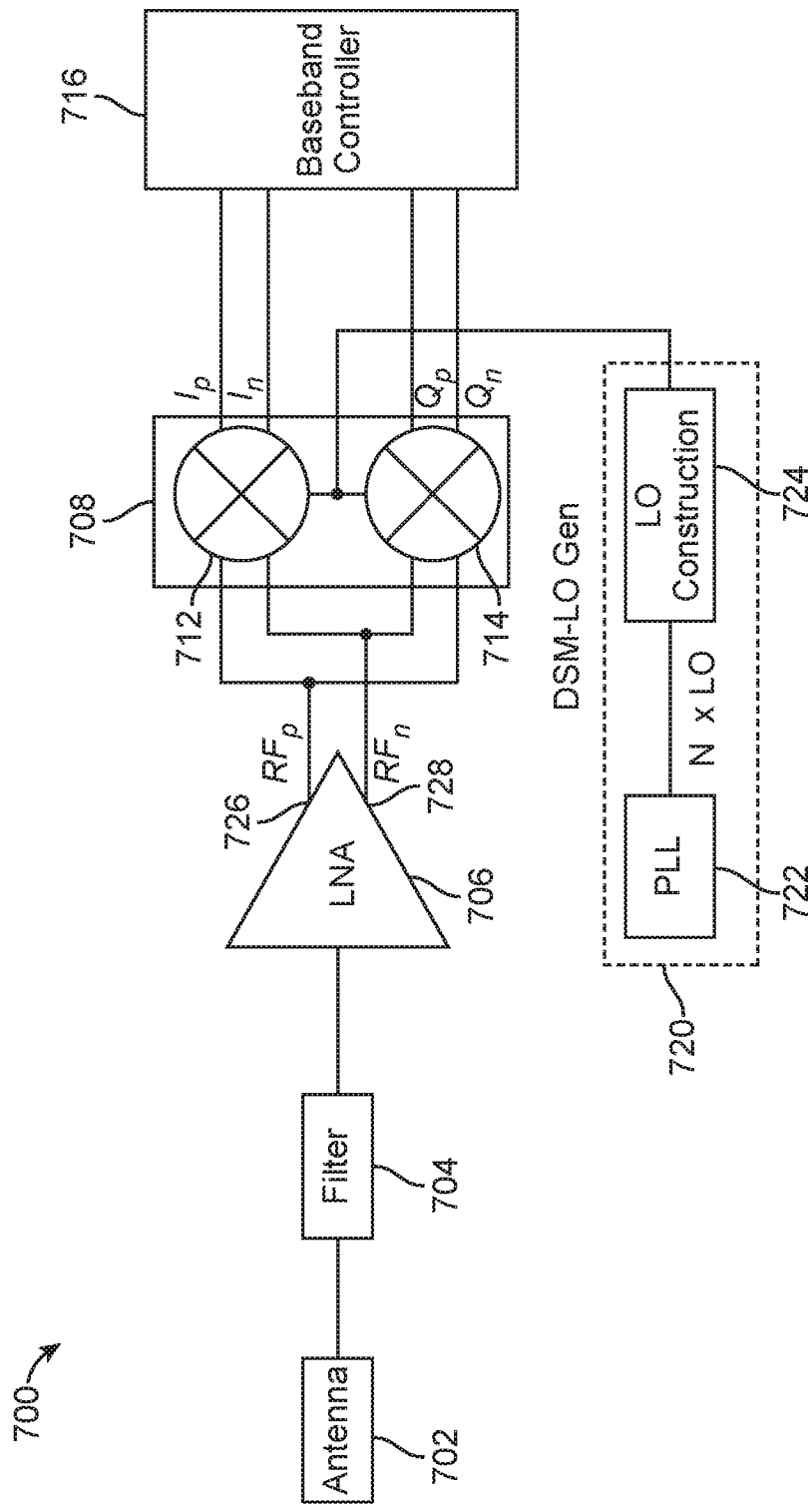
FIG. 7 is a schematic diagram illustrating an exemplary design of a receiver, consistent with some embodiments of the present disclosure.

FIG. 7 is a schematic diagram illustrating an exemplary design of a receiver, consistent with some embodiments of the present disclosure. Referring to FIG. 7, a receiver 700 includes an antenna 702, a filter 704, a low-noise amplifier (LNA) 706, a mixer 708, a baseband controller 716, and a direct sampling mixer (DSM) local oscillating (LO) signal generator 720. Mixer 708 includes an in-phase mixer 712 and a quadrature phase mixer 714. DSM-LO generator 720 includes a phase-locked loop (PLL) circuit 722 and a local oscillating signal (LO) constructor 724. Antenna 702 may be configured to receive signals from one or more sources. In some embodiments, the signals received by antenna 102 are radio frequency (RF) signals in communication systems. However, the signals are not so limited, and the signals received by antenna 702 can be any electromagnetic waves transmitted from any sources.

A signal received by antenna 702 is first passed through filter 704 (e.g., a bandpass filter) to suppress frequencies outside a range of interest. The filtered signal is then passed to LNA 706 and amplified by LNA 706. In an embodiment, LNA 706 may include a controller that controls parameters of an amplified signal. The parameters may include at least one of: gain, noise, linearity, bandwidth, output dynamic range, slew rate, rise rate, overshoot, or stability factor. In an alternative embodiment, filter 704 is not implemented in receiver 700 and LNA 706 is instead directly coupled to antenna 702.

In receiver 700, LNA 706 is a single-input to differential-outputs amplifier, as shown in FIG. 7. In an alternative embodiment, LNA 706 may instead be a differential-inputs to differential-outputs amplifier. In FIG. 7, LNA 706 includes a positive differential output 726 that outputs a signal having a positive component (e.g., an RF voltage signal having a positive component RFp), and a negative differential output 728 that outputs a signal having a negative component (e.g., an RF voltage signal having a negative component RFn). Each of the differential outputs 726 and 728 may output an in-phase signal and a quadrature phase signal. In an alternative embodiment, LNA 706 may be optional.

In-phase mixer 712 is coupled to differential outputs 726 and 728 of LNA 706 and configured to receive a positive in-phase signal from positive differential output 726 and a negative in-phase signal from negative differential output 728. Similarly, quadrature phase mixer 714 is coupled to the differential outputs 726 and 728 of LNA 706 and configured to receive a positive quadrature phase signal from positive differential output 726 and a negative quadrature phase signal from negative differential output 728. Each of mixers 712 and 714 is configured to sample the received amplified signal at a plurality of discrete points in time to obtain a discrete-time sampled signal based on a local oscillating signal provided by DSM-LO generator 720.

In some embodiment, DSM-LO generator 720 may include a reference oscillator such as a crystal oscillator or a voltage-controlled oscillator, or the like (not shown) that generates a reference signal. PLL 722 receives the reference signal and generates an oscillator signal. LO constructor 724 constructs a local oscillating signal to control the sampling in mixer 708. In an embodiment, LO constructor 724 may include a signal multiplier that multiplies the oscillator signal and combines the multiplied oscillator signal with the original oscillator signal to construct a complex local oscillating signal. In an alternative embodiment, LO constructor 724 may instead include a signal divider that divides the local oscillator signal and combines the divided oscillator signal with the original oscillator signal to construct a complex local oscillating signal. The generated complex local oscillating signal is provided to in-phase mixer 712 and quadrature phase mixer 714 such that the sampling in each of mixers 712 and 714 is controlled by the complex local oscillating signal. In an embodiment, the DSM-LO generator 720 may generate a complex local oscillating signal by combining a plurality of local oscillating signals having different frequencies.

Mixers 712 and 714 output the discrete-time sampled signals to baseband controller 716. Baseband controller 716 is configured to check a quality of the signals and determine a desired waveform. For example, if a current waveform corresponds to a zero-IF mode and the baseband controller 116 determines that quality of the sampled signals is not satisfactory, baseband controller 116 may select a waveform that corresponds to a superheterodyne as a desired waveform. Based on the desired waveform, baseband controller 716 may send a feedback signal (not shown) to DSM-LO generator 720 in response to which DSM-LO generator 720 can provide a desired complex local oscillating signal to mixers 712 and 714.

By constructing a complex local oscillating signal to control a discrete-time sampling in a mixer, a desired effective mixing waveform is obtained without implementing a sample reordering circuit. This permits a local oscillating frequency at a frequency different from a center frequency of a selected channel, thereby suppressing interference caused by harmonic blockers. Moreover, by using discrete-time quadrature phase mixers, negative frequency image rejection is achieved, further enhancing signal quality.

Figure 8:
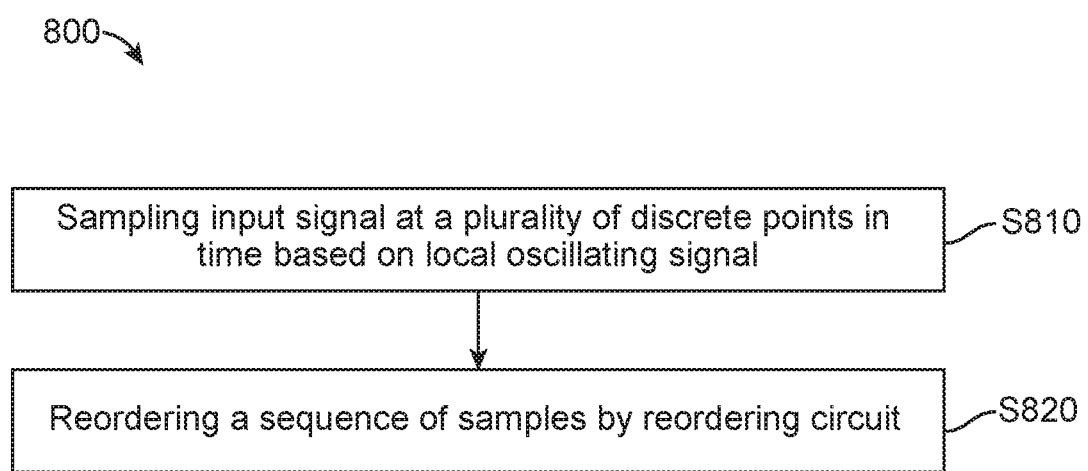
FIG. 8 is a flow chart illustrating an exemplary method for processing a signal, consistent with some embodiments of the present disclosure.

FIG. 8 is a flow chart illustrating an exemplary method for processing a signal, consistent with some embodiments of the present disclosure. The method may be performed by a receiver, such as receiver 100 of FIG. 1. Referring to FIG. 8, a method 800 includes a step S810 of sampling an input signal at a plurality of discrete points in time based on a local oscillating signal. For example, mixer 108 of receiver 100 (FIG. 1) receives an input analog signal and samples the signal at a plurality of discrete points in time. This sampling is controlled by a local oscillating signal generated by a local oscillating signal generator, such as LO generator 120 of receiver 100. The input analog signal includes differential signals.

Method 800 also includes a step S820 of reordering a sequence of the samples by a reordering circuit, such as sample reordering circuit 110 of FIG. 1. For example, sample reordering circuit 110 receives discrete-time samples from mixer 108 and performs a second sampling on the received samples. This second sampling is controlled by a clock signal generated by the LO generator 120, for example, by dividing the frequency of LO signal provided to mixer 108 by an integer. By reordering discrete-time samples outputted from the mixer, a desired effective mixing waveform is obtained. This permits a local oscillating frequency at a frequency different from a center frequency of a selected channel, thereby suppressing interference caused by harmonic blockers, without utilizing costly filters.

Figure 9:
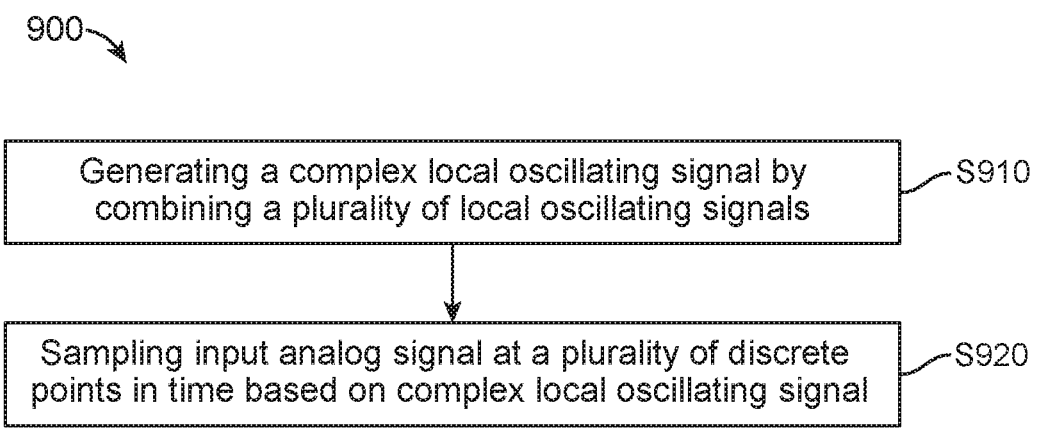
FIG. 9 is a flow chart illustrating another exemplary method for processing a signal, consistent with some embodiments of the present disclosure.

FIG. 9 is a flow chart illustrating another exemplary method for processing a signal, consistent with some embodiments of the present disclosure. The method may be performed by a receiver, such as receiver 700 of FIG. 7. Referring to FIG. 9, a method 900 includes a step S910 of generating a complex local oscillating signal by combining a plurality of local oscillating signals. For example, DSM-LO generator 720 of receiver 700 (FIG. 7) generates a complex local oscillating signal by multiplying or dividing an oscillator signal generated by PLL 722 and combining the original oscillator signal (before multiplication or division) with the multiplied or divided signal.

Method 900 also includes a step S920 of sampling an input analog signal at a plurality of discrete points in time based on the complex local oscillating signal. For example, mixer 708 of receiver 700 receives an input analog signal and samples the signal at a plurality of discrete points in time. This sampling is controlled by the complex local oscillating signal generated by DSM-LO generator 720 of receiver 700. By constructing a complex local oscillating signal to control a discrete-time sampling in a mixer, a desired effective mixing waveform is obtained without implementing a sample reordering circuit, leading to an improved signal quality and reduced size of the receiver.

Figure 10:
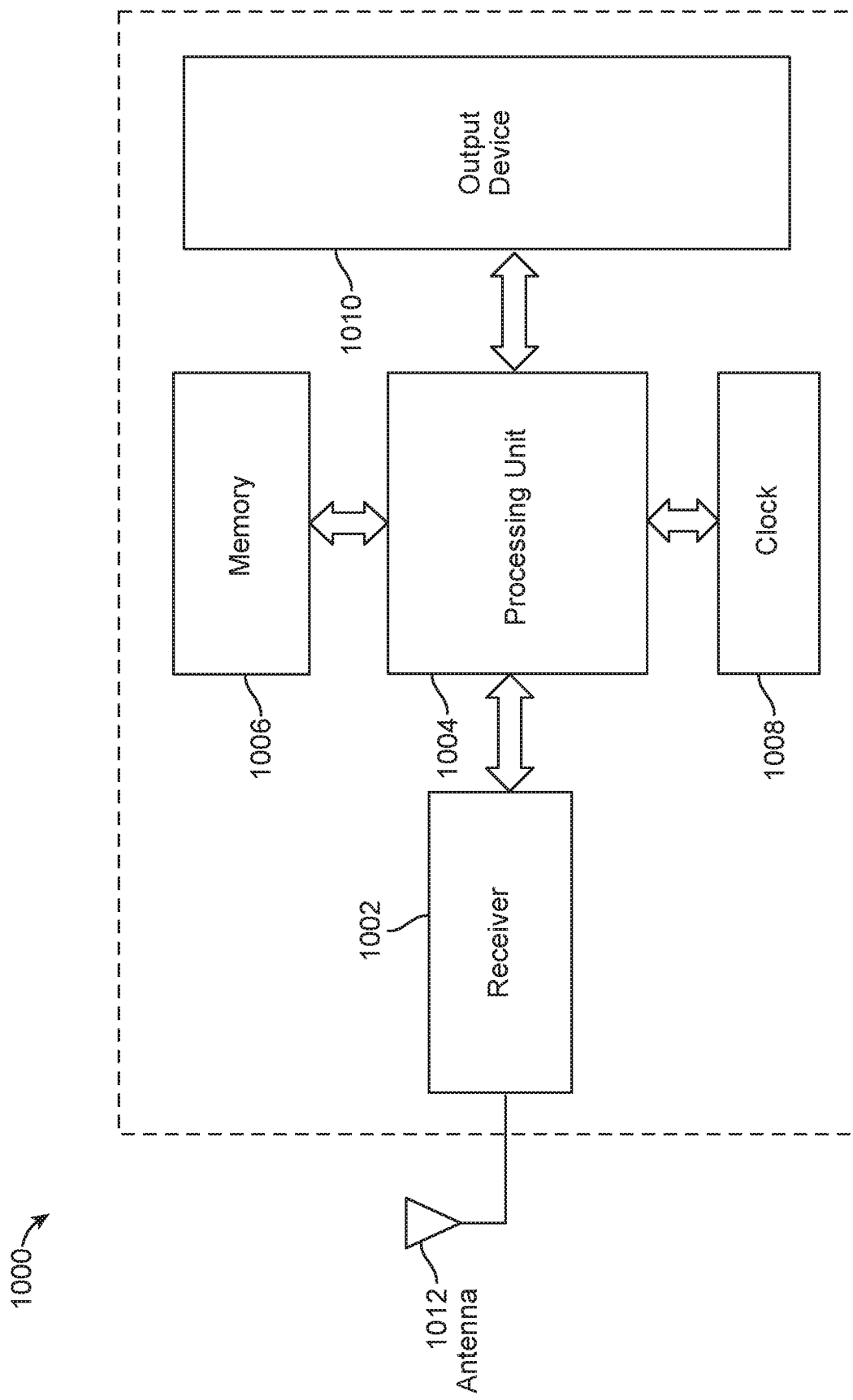
FIG. 10 is a block diagram of a device, consistent with some embodiments of the present disclosure.

FIG. 10 is a block diagram of an exemplary device, consistent with some embodiments of the present disclosure. Referring to FIG. 10, a device 1000 may take any form, including but not limited to, a laptop computer, a Global Positioning System (GPS), a wireless terminal including a mobile phone, a wireless handheld device, or wireless personal device, or any other forms. Device 1000 includes a receiver 1002, an antenna 1012 coupled with receiver 1002, a processing unit 1004, a memory 1006, a local clock 1008, and an output device 1010.

Receiver 1002, coupled to antenna 1012, is configured to receive a signal from one or more signal sources. In some embodiments, receiver 1002 may be part of a transceiver modem which includes a transmitter configured to transmit data to an external device. Local clock 1008 provides a time of a local place at which device 1000 is disposed.

In an embodiment, similar to receiver 100 of FIG. 1, receiver 1002 may implement a sample reordering circuit (not shown), such as sample reordering circuit 110 of FIG. 1, to reorder a sequence of discrete-time samples outputted from a mixer (not shown).

In another embodiment, instead of a sample reordering circuit, receiver 1002 may implement a DSM-LO generator, such as DSM-LO generator 720 of FIG. 7, to generate a complex local oscillating signal to control sampling in a mixer.

Receiver 1002 may include other components, such as an analog-to-digital signal converter, to further process the obtained mixed signal. For brevity, descriptions of these components are omitted here.

Processing unit 1004 may include one or more dedicated processing units, application-specific integrated circuits (ASICs), field-programmable gate arrays (FPGAs), or various other types of processors or processing units. Processing unit 1004 may be configured to perform computations on the signal processed by receiver 1002. Processing unit 1004 may be further configured to control the signal processing in receiver 1002.

Memory 1006 may be any type of computer-readable storage medium including volatile or non-volatile memory devices, or a combination thereof. Memory 1006 may be configured to store information related to identities of device 1000 and signals received by receiver 1002. Memory 1006 may also store computer-readable program instructions and mathematical models that are used in signal processing in receiver 1002. Memory 1006 may further store computer-readable program instructions for execution by processing unit 1004 to operate device 1000 in a certain mode (e.g., a superheterodyne mode or a zero-IF mode).

Output device 1010 may be used to report a result of signal processing to a user or another device. Output device 1010 may include a user interface including a display and an input device to transmit a user command to processing unit 1004. The display may be configured to display a status of signal reception at device 1000, the data stored at memory 1006, a status of signal processing, etc. The display may include, but is not limited to, cathode ray tube (CRT), liquid crystal display (LCD), light-emitting diode (LED), gas plasma, a touch screen, or other image projection devices for displaying information to a user. The input device may be any type of computer hardware equipment used to receive data and control signals from a user. The input device may include, but is not limited to, a keyboard, a mouse, a scanner, a digital camera, a joystick, a trackball, cursor direction keys, a touchscreen monitor, or audio/video commanders, etc. Output device 1010 may further include a machine interface, such as an electrical bus connection or a wireless communications link.

Figure 11:
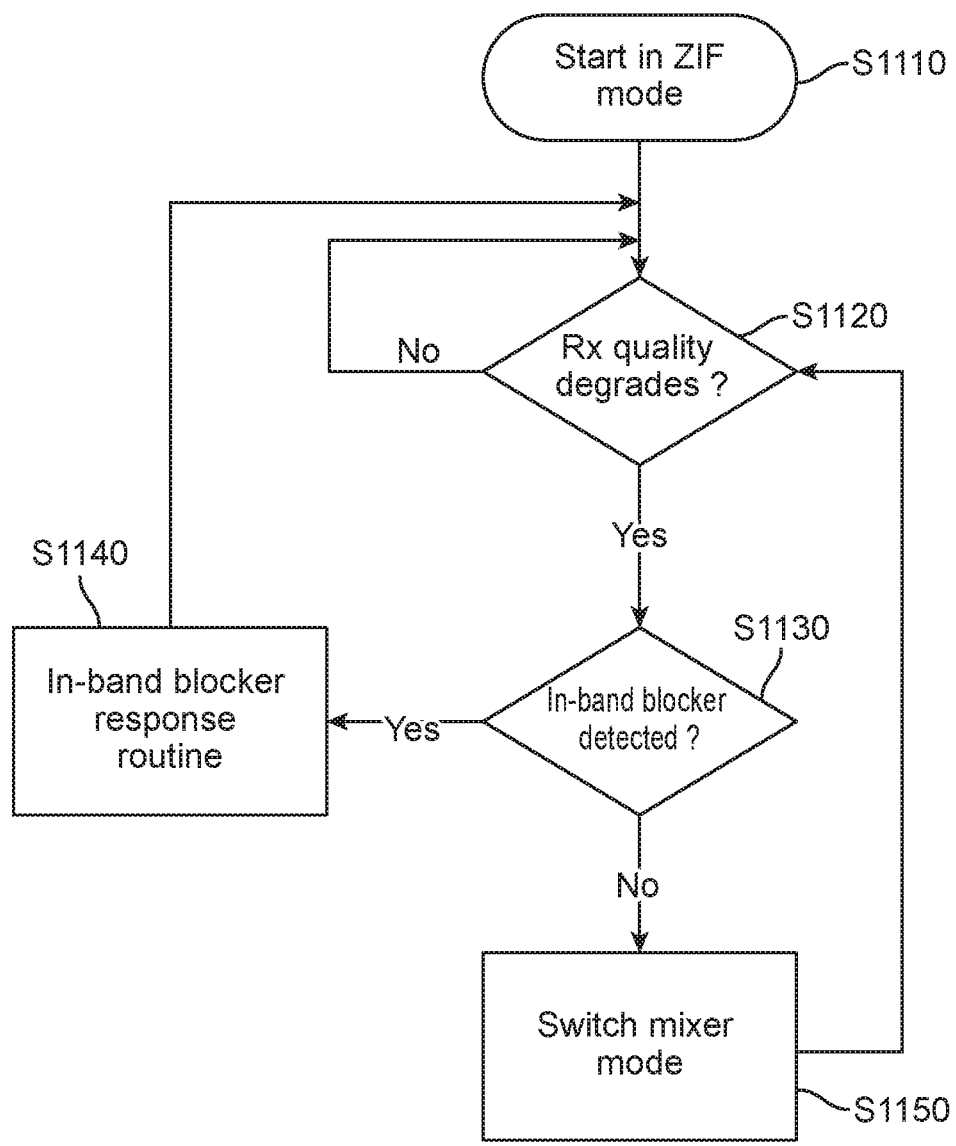
FIG. 11 is a flow chart illustrating an exemplary method for operating a receiver, consistent with some embodiments of the present disclosure.

FIG. 11 is a flow chart illustrating an exemplary method for operating a receiver, consistent with some embodiments of the present disclosure. The method may be performed by a device including a receiver, such as one of the receivers illustrated in FIGS. 1-7. Referring to FIG. 11, a method 1100 includes a step S1110 of starting operation of the receiver in a zero-IF mode.

Method 1100 includes a step S1120 of determining whether performance of the receiver is degraded. In an embodiment, the performance of the receiver may be determined by considering parameters of a receiver signal including at least one of: an image signal strength, a blocker signal strength, a signal-to-noise ratio, or a power level at a signal pipeline. For example, a measured value of a parameter may be compared with a threshold value to determine the performance of the receiver.

If the performance of the receiver is not degraded (No in step S1120), the receiver may be continuously operated in the zero-IF mode. On the other hand, if the performance of the receiver is degraded (Yes in step S1120), method 1100 performs step S1130 of detecting whether an in-band blocker is present.

If the in-band blocker is not detected (No in step S1130), method 1100 performs a step S1150 of switching the operating mode of the receiver, for example, to a superheterodyne mode. In an embodiment, switching to the superheterodyne mode may be realized by reordering time-discrete samples outputted from a mixer, by using a sample reordering circuit, such as sampling reordering circuits shown in FIG. 1, FIGS. 4-6. In another embodiment, switching to the superheterodyne mode may be realized by mixing an input analog signal with a complex local oscillating signal, as shown in FIG. 7.

On the other hand, if the in-band blocker is detected (Yes in step S1130), method 1100 performs a step S1140 of an in-band blocker response routine in the zero-IF mode. By dynamically monitoring receiver performance and switching between different modes based on the receiver performance, degradation of the signal quality in the receiver is avoided, leading to an enhanced agility of the receiver.

Figure 12:
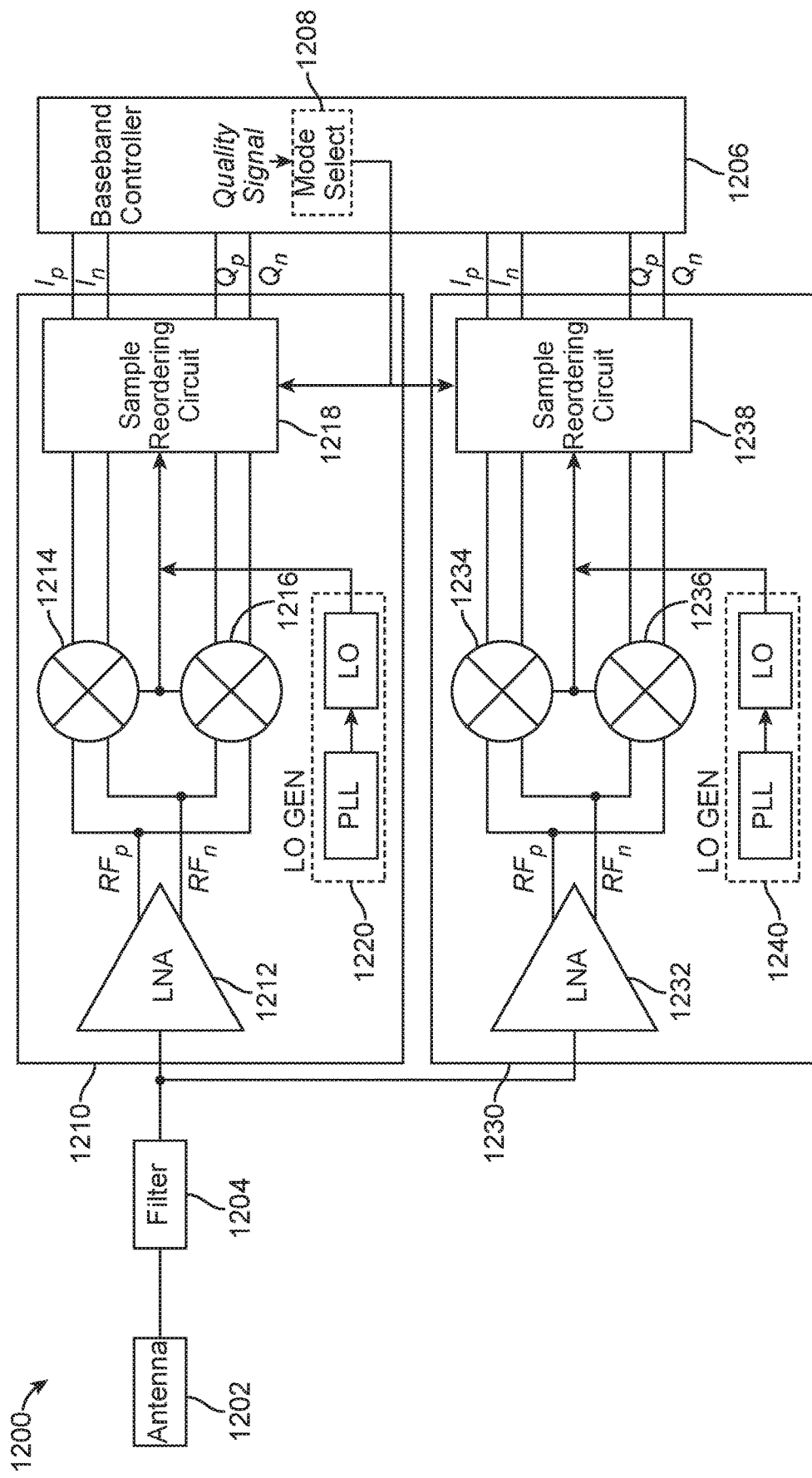
FIG. 12 is a schematic diagram illustrating an exemplary design of a receiver, consistent with some embodiments of the present disclosure.

FIG. 12 is a schematic diagram illustrating an exemplary design of a receiver, consistent with some embodiments of the present disclosure. Referring to FIG. 12, an exemplary receiver 1200 includes an antenna 1202, a filter 1204, a first receiving unit 1210, a second receiving unit 1230, and a baseband controller 1206 including a mode selector 1208. First receiving unit 1210 includes a low-noise amplifier (LNA) 1212, an in-phase mixer 1214, a quadrature phase mixer 1216, a sample reordering circuit 1218, and a local oscillating signal (LO) generator 1220 comprising a phase-locked loop (PLL) circuit and a local oscillating signal (LO) constructor. Similarly, second receiving unit 1230 includes a low-noise amplifier (LNA) 1232, an in-phase mixer 1234, a quadrature phase mixer 1236, a sample reordering circuit 1238, and a local oscillating signal (LO) generator 1240 comprising a PLL circuit and a LO constructor.

Antenna 102 may be configured to receive analog signals from one or more sources and transmit the signal to filter 1204 for filtering. The filtered signal is passed to each of receiving unit 1210 and receiving unit 1230 so that the two receiving units receive the same channel signal. In first receiving unit 1210, the signal is amplified by LNA 1212, sampled by in-phase mixer 1214 and quadrature phase mixer 1216, and reordered by sample reordering circuit 1218.

Similarly, in second receiving unit 1230, the signal is amplified by LNA 1232, sampled by in-phase mixer 1234 and quadrature phase mixer 1236, and reordered by sample reordering circuit 1238. The detailed operations are similar to the operations described with respect to FIGS. 1 and 4-6.

In an embodiment, first receiving unit 1210 may operate in a zero-IF mode and second receiving unit 1230 may operate in a superheterodyne mode. Baseband controller 1206 may be configured to monitor performance of first receiving unit 1210 and second receiving unit 1230 to determine whether to switch one of the modes to the other. For example, if baseband controller 1206 determines that performance of first receiving unit 1210 operating in the zero-IF mode is much better than that of second receiving unit 1230, mode selector 1208 of the baseband controller 1206 may send an instruction to second receiving unit 1230 to request second receiving unit 1230 to switch to a zero-IF mode. Similarly, if baseband controller 1206 determines that performance of second receiving unit 1230 operating in superheterodyne mode is much better than that of first receiving unit 1210, mode selector 1208 of the baseband controller 1206 may send an instruction to first receiving unit 1210 to instruct first receiving unit 1210 to switch to a superheterodyne mode. In an embodiment, mode selector 1208 of baseband controller 1206 may send the instruction to sample reordering circuit 1208 or sample reordering circuit 1238 so the sample reordering circuits may perform sample reordering to obtain a desired waveform.

In an alternative embodiment, at least one of first receiving unit 1210 and second receiving unit 1230 does not include a sample reordering circuit, and performs the mode switching by mixing signals based on a complex local oscillating signal, as described with respect to FIG. 7.

In an embodiment, mode selector 1208 may instruct both first receiving unit 1210 and second receiving unit 1230 to operate in a third operating mode, different from the zero-IF and the superheterodyne mode. In an embodiment, first receiving unit 1210 and second receiving unit 1230 may be two different receivers implemented in a single device.

In an alternative embodiment, receiver 1200 may include a plurality of receiving units that operate in a plurality of operating modes. In such an embodiment, mode selector 1208 may select one of the plurality of modes as a best mode and instruct to switch to operating in that selected mode.

Figure 13:
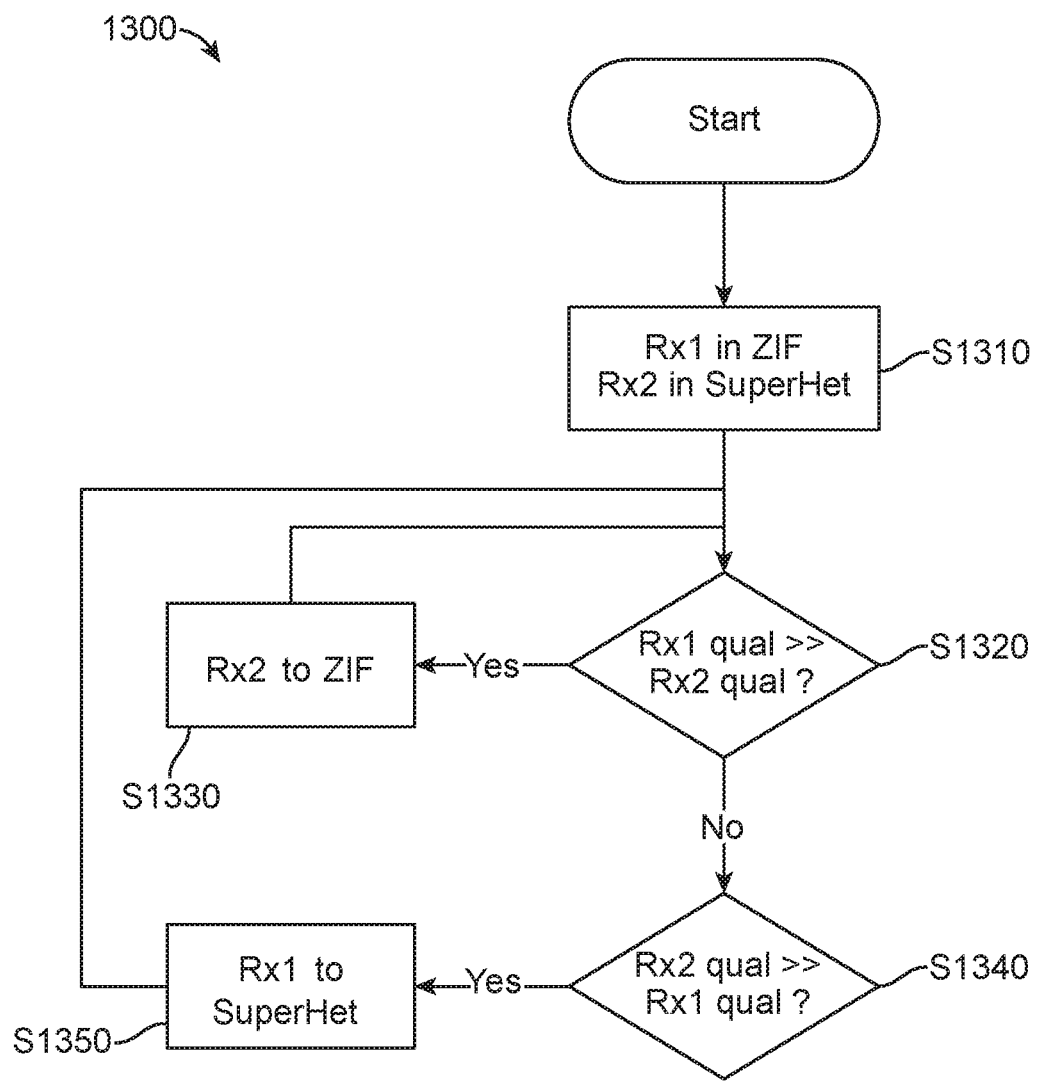
FIG. 13 is a flow chart illustrating an exemplary method for operating a receiver, consistent with some embodiments of the present disclosure.

FIG. 13 is a flow chart illustrating an exemplary method for operating a device, consistent with some embodiments of the present disclosure. The method may be performed by a device including two receivers or a device including a receiver having two receiving units (e.g., receiver 1200 of FIG. 12). Referring to FIG. 13, a method 1300 includes a step S1310 of starting operation of a first receiver in a zero-IF mode and operation of a second receiver in a superheterodyne mode.

Method 1300 includes a step S1320 of determining whether performance of the first receiver is much better than that of the second receiver. In an embodiment, performance of a receiver may be determined by considering parameters of a signal including at least one of: an image signal strength, a blocker signal strength, a signal-to-noise ratio, or a power level at a signal pipeline. For example, a difference between a parameter in the first receiver and the parameter in the second receiver may be compared with a threshold value to determine that the performance of the first receiver is much better than the performance of the second receiver.

If the performance of the first receiver is much better than that of the second receiver (Yes in step S1320), the operation mode of the second receiver is switched to the zero-IF mode (step S1330). On the other hand, if the performance of the first receiver is not much better than that of second receiver (No in step S1320), method 1300 performs step S1340 of determining whether the performance of the second receiver is much better than that of the first receiver.

If the performance of the second receiver is much better than that of the first receiver (Yes in step S1340), method 1300 performs a step S1350 of switching the operating mode of the first receiver to the superheterodyne mode. In an embodiment, switching between the operating modes may be realized by implementing a sample reordering circuit, such as sampling reordering circuits shown in FIG. 1 and FIGS. 4-6. In another embodiment, switching between the operating modes may be realized by mixing an input analog signal with a complex local oscillating signal, as shown in FIG. 7. By dynamically monitoring performance of the receivers and switching between the different operating modes, degradation of signal quality in the receivers can be avoided, leading to enhanced agility of the receivers.

The computer-readable storage medium of the present disclosure may be a tangible device that can store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing.

The computer-readable program instructions of the present disclosure may be assembler instructions, instruction-set-architecture (ISA) instructions, machine instructions, machine-dependent instructions, microcode, firmware instructions, state-setting data, or source code or object code written in any combination of one or more programming languages, including an object-oriented programming language, and conventional procedural programming languages. The computer-readable program instructions may execute entirely on a computing device as a stand-alone software package, or partly on a first computing device and partly on a second computing device remote from the first computing device. In the latter scenario, the second, remote computing device may be connected to the first computing device through any type of network, including a local area network (LAN) or a wide area network (WAN).

The flowcharts and block diagrams in the figures illustrate examples of the architecture, functionality, and operation of possible implementations of systems, methods, and devices according to various embodiments. It should be noted that, in some alternative implementations, the functions noted in blocks may occur out of the order noted in the figures. For example, two blocks shown in succession may, in fact, be executed substantially concurrently, or the blocks may sometimes be executed in the reverse order, depending upon the functionality involved.

It is understood that the described embodiments are not mutually exclusive, and elements, components, materials, or steps described in connection with one example embodiment may be combined with, or eliminated from, other embodiments in suitable ways to accomplish desired design objectives.

Reference herein to "some embodiments" or "some exemplary embodiments" means that a particular feature, structure, or characteristic described in connection with the embodiment can be included in at least one embodiment. The appearance of the phrases "one embodiment" "some embodiments" or "another embodiment" in various places in the present disclosure do not all necessarily refer to the same embodiment, nor are separate or alternative embodiments necessarily mutually exclusive of other embodiments.

It should be understood that the steps of the example methods set forth herein are not necessarily required to be performed in the order described, and the order of the steps of such methods should be understood to be merely example. For example, two blocks shown in succession may, in fact, be executed substantially concurrently, or the blocks may sometimes be executed in the reverse order, depending upon the functionality involved. Likewise, additional steps may be included in such methods, and certain steps may be omitted or combined, in methods consistent with various embodiments.

As used in the present disclosure, the word "exemplary" is used herein to mean serving as an example, instance, or illustration. Any aspect or design described herein as "exemplary" is not necessarily to be construed as preferred or advantageous over other aspects or designs. Rather, use of the word is intended to present concepts in a concrete fashion.

As used in the present disclosure, unless specifically stated otherwise, the term "or" encompasses all possible combinations, except where infeasible. For example, if it is stated that a database may include A or B, then, unless specifically stated otherwise or infeasible, the database may include A, or B, or A and B. As a second example, if it is stated that a database may include A, B, or C, then, unless specifically stated otherwise or infeasible, the database may include A, or B, or C, or A and B, or A and C, or B and C, or A and B and C.

Additionally, the articles "a" and "an" as used in the present disclosure and the appended claims should generally be construed to mean "one or more" unless specified otherwise or clear from context to be directed to a singular form.

Unless explicitly stated otherwise, each numerical value and range should be interpreted as being approximate as if the word "about" or "approximately" preceded the value of the value or range.

Although the elements in the following method claims, if any, are recited in a particular sequence, unless the claim recitations otherwise imply a particular sequence for implementing some or all of those elements, those elements are not necessarily intended to be limited to being implemented in that particular sequence.

It is appreciated that certain features of the present disclosure, which are, for clarity, described in the context of separate embodiments, may also be provided in combination in a single embodiment. Conversely, various features of the specification, which are, for brevity, described in the context of a single embodiment, may also be provided separately or in any suitable subcombination or as suitable in any other described embodiment of the specification. Certain features described in the context of various embodiments are not essential features of those embodiments, unless noted as such.

It will be further understood that various modifications, alternatives and variations in the details, materials, and arrangements of the parts which have been described and illustrated in order to explain the nature of described embodiments may be made by those skilled in the art without departing from the scope. Accordingly, the following claims embrace all such alternatives, modifications and variations that fall within the terms of the claims.

What is claimed is:

1. A receiver, comprising:
one or more mixers configured to sample an input analog signal at a plurality of discrete points in time to obtain a discrete-time sampled signal, having a sequence of a plurality of samples, based on a local oscillator signal provided by a local oscillator; and
a sample reordering circuit coupled to the one or more mixers and configured to reorder the sequence of the plurality of samples received from the one or more mixers to a different sequence of the plurality of samples.

2. The receiver of claim 1, wherein the one or more mixers are configured to perform shifting the sampled signal to an intermediate frequency determined by a difference between a frequency of the input analog signal and a frequency of the local oscillator signal such that the receiver operates in superheterodyne mode.

3. The receiver of claim 1, wherein a frequency of the local oscillator signal is the same as a frequency of the input analog signal such that the receiver operates in a zero-intermediate frequency (zero-IF) mode.

4. The receiver of claim 1, further comprising:
a clock generator configured to provide a clock signal to the sample reordering circuit,
wherein a frequency of the clock signal is $f_{LO}/N$, where $f_{LO}$ is a frequency of the local oscillator signal, and N is an integer.

5. The receiver of claim 1, wherein:
the one or more mixers comprise:
a first mixer comprising a plurality of in-phase switches including first, second, third, and fourth in-phase switches; and
a second mixer comprising a plurality of quadrature-phase switches including first, second, third, and fourth quadrature-phase switches.

6. The receiver of claim 5, further comprising:
a low-noise amplifier coupled to the one or more mixers and configured to provide the input analog signal to the one or more mixers,
wherein the input analog signal is a differential signal and the low-noise amplifier comprises:
a first differential output coupled to the first in-phase switch of the first mixer, the second in-phase switch of the first mixer, the first quadrature-phase switch of the second mixer, and the second quadrature-phase switch of the second mixer; and
a second differential output coupled to the third in-phase switch of the first mixer, the fourth in-phase switch of the first mixer, the third quadrature-phase switch of the second mixer, and the fourth quadrature-phase switch of the second mixer.

7. The receiver of claim 5, wherein:
the local oscillator is configured to provide the local oscillator signal with a plurality of phase shifts including 0° and 90° phase shifts to drive the first mixer and the second mixer, respectively.

8. The receiver of claim 1, wherein the sample reordering circuit is configured to reorder the sequence of the plurality of samples by performing another sampling on the plurality of samples received from the one or more mixers.

9. The receiver of claim 1, further comprising:
a controller configured to provide a feedback signal,
wherein the sample reordering circuit is configured to determine the different sequence based on the feedback signal received from the controller.

10. A method for processing an input analog signal, the method comprising:
sampling, at one or more mixers, the input analog signal at a plurality of discrete points in time to obtain a sampled signal, having a sequence of a plurality of samples, based on a local oscillator signal; and
reordering the sequence of the plurality of samples in the sampled signal to a different sequence of the plurality of samples.

11. The method of claim 10, further comprising:
filtering the sample-reordered signal.

12. A non-transitory computer-readable medium having stored therein instructions that, when executed by a processor of a controller, perform a method for processing an input analog signal, the method comprising:
sampling, at one or more mixers, the input analog signal at a plurality of discrete points in time to obtain a sampled signal, having a sequence of a plurality of samples, based on a local oscillator signal; and
reordering, by a sample reordering circuit, the sequence of the plurality of samples in the sampled signals to a different sequence of the plurality of samples.

* * * * *